(12) United States Patent
Yamasaki et al.

(10) Patent No.: US 7,874,261 B2
(45) Date of Patent: Jan. 25, 2011

(54) STAGE APPARATUS AND COATING TREATMENT DEVICE

(75) Inventors: Tsuyoshi Yamasaki, Koshi (JP); Masataka Sakai, Koshi (JP)

(73) Assignee: Tokyo Electron Limited, Tokyo (JP)

(*) Notice: Subject to any disclaimer, the term of this patent is extended or adjusted under 35 U.S.C. 154(b) by 676 days.

(21) Appl. No.: 11/816,784

(22) PCT Filed: Feb. 15, 2006

(86) PCT No.: PCT/JP2006/302623

§ 371 (c)(1),
(2), (4) Date: Aug. 21, 2007

(87) PCT Pub. No.: WO2006/090619

PCT Pub. Date: Aug. 31, 2006

(65) Prior Publication Data

US 2009/0013927 A1    Jan. 15, 2009

(30) Foreign Application Priority Data

Feb. 23, 2005   (JP)   ............................... 2005-046422

(51) Int. Cl.
*B05C 13/00*   (2006.01)
(52) U.S. Cl. .................. 118/500; 414/222.01
(58) Field of Classification Search .............. 118/500; 414/222.01
See application file for complete search history.

(56) References Cited

U.S. PATENT DOCUMENTS 4,938,994 A   7/1990   Choinski

FOREIGN PATENT DOCUMENTS

JP   3-38843   4/1991

(Continued)

OTHER PUBLICATIONS

Machine Translation of JP2004331265.*

(Continued)

*Primary Examiner*—Parviz Hassanzadeh
*Assistant Examiner*—Albert Hilton
(74) *Attorney, Agent, or Firm*—Oblon, Spivak, McClelland, Maier & Neustadt, L.L.P.

(57) ABSTRACT

A stage apparatus includes a stage over which a substrate is to be transferred, and a levitation mechanism which levitates the substrate over the stage. The stage includes a plurality of gas spray ports (16a) to spray a gas for levitating the substrate (G), and a plurality of suction ports (16b) to take in air sprayed from the gas spray ports (16a). The plurality of gas spray ports (16a) and the plurality of suction ports (16b) are set not to be arranged on straight lines parallel to a substrate transfer direction in a predetermined length along the substrate transfer direction.

14 Claims, 10 Drawing Sheets

FOREIGN PATENT DOCUMENTS

| | | |
|---|---|---|
| JP | 3-130033 | 6/1991 |
| JP | 4 61958 | 2/1992 |
| JP | 5-51130 | 3/1993 |
| JP | 7-228346 | 8/1995 |
| JP | 10 156255 | 6/1998 |
| JP | 2000-72251 | 3/2000 |
| JP | 2001 250857 | 9/2001 |
| JP | 2002-151571 | 5/2002 |
| JP | 2002151571 A * | 5/2002 |
| JP | 2002 321820 | 11/2002 |
| JP | 2004 44330 | 2/2004 |
| JP | 2004 218156 | 8/2004 |
| JP | 2004-331265 | 11/2004 |
| JP | 2004331265 A * | 11/2004 |
| WO | 03 060961 | 7/2003 |

OTHER PUBLICATIONS

Machine Translation of JP2002151571.*

* cited by examiner

STAGE APPARATUS AND COATING TREATMENT DEVICE

TECHNICAL FIELD

The present invention relates to a stage apparatus used for transferring a substrate such as a glass substrate employed in an FPD (Flat Panel Display) such as a liquid crystal display device (LCD), and a coating system comprising the stage apparatus.

BACKGROUND ART

For example, in a manufacturing process for a liquid crystal display apparatus (LCD), a predetermined circuit pattern is formed on a glass substrate by using photolithography. More specifically, a resist liquid is supplied to the glass substrate to form a coating film. After drying and heat treating the coating film, a light exposure process and a developing process are successively performed.

As an apparatus that supplies a resist liquid to a glass substrate to form a coating film, there is known a coating film forming system (for example, see Patent Document 1) including a stage which vacuum chucks a glass substrate horizontally, a resist nozzle which supplies the resist liquid to the substrate held on the stage, and a moving mechanism which moves the stage and resist nozzle relative to each other in the horizontal direction.

When holding the glass substrate by vacuum chucking, however, suction holes formed in the stage tend to be printed onto the surface of the glass substrate, and many particles attach to the lower surface of the substrate. Since either the resist nozzle or the stage must be moved, the apparatus becomes bulky with a complicated structure and requires a high power cost.

Patent Document 1: Jpn. Pat. Appln. KOKAI Publication No. 10-156255

DISCLOSURE OF INVENTION

It is an object of the present invention to provide a stage apparatus with a simple apparatus arrangement, which can prevent suction holes from being printed on a substrate during a coating process, and can decrease particles attaching to the lower surface of the substrate, and further to provide a coating system which uses the stage apparatus.

As a technique to solve the above problems, the present inventors previously studied an apparatus which, while transferring a glass substrate in an almost horizontal posture without chucking and holding it on a stage, supplies a resist liquid onto the surface of the glass substrate to form a coating film. This resulted in patent applications concerning a processing apparatus of a levitation substrate transfer type configured to apply a resist liquid onto the surface of a substrate while transferring the substrate by levitation (Japanese Patent Applications No. 2004-44330 and No. 2004-218156).

As a substrate levitating stage used in the processing apparatus of a levitation substrate transfer type, stages 301 and 305 are available. As shown in FIG. 1A, the stage 301 has gas spray ports 311 and suction ports 312, and levitates the substrate to a predetermined height from the stage surface by balancing the gas spray amount and suction amount. As shown in FIG. 1B, the stage 305 has the gas spray ports 311 and grooves 313, and levitates the substrate to a predetermined height from the stage surface by balancing the gas spray amount and exhaust amount from the grooves 313.

In the stage 301 shown in FIG. 1A, the gas spray ports 311 and suction ports 312 are alternately formed to be arranged on straight lines at predetermined pitches in a substrate transfer direction and the direction perpendicular to the substrate transfer direction. In the stage 305 shown in FIG. 1B, the gas spray ports 311 are formed at predetermined pitches in the substrate transfer direction and the direction perpendicular to the substrate transfer direction. The grooves 313 are formed at predetermined pitches in the direction perpendicular to the substrate transfer direction such that the longitudinal direction of the grooves 313 matches the substrate transfer direction.

However, where the gas spray ports 311, suction ports 312, and grooves 313 are arranged in this manner, a predetermined area of the substrate always passes over the grooves 313, and the remaining area of the substrate always passes over the gas spray ports 311 (and suction ports 312). Hence, striped printed marks (i.e., thickness nonuniformity of a resist film) are formed depending on the arrangement of the gas spray ports 311, suction ports 312, and grooves 313. These printed marks finally cause variations in an image quality.

The present invention can achieve the above object without causing the above problems.

According to a first aspect of the present invention, there is provided a stage apparatus comprising a stage over which a substrate is to be transferred and a levitation mechanism which levitates the substrate over the stage, wherein the stage includes a plurality of gas spray ports to spray a gas for levitating the substrate, and a plurality of suction ports to take in air sprayed from the gas spray ports, and said plurality of gas spray ports and said plurality of suction ports are set not to be arranged on straight lines parallel to a substrate transfer direction in a predetermined length along the substrate transfer direction.

The stage apparatus according to the first aspect is preferably arranged such that an interval between the adjacent gas spray ports is 1 cm to 5 cm, an interval between the adjacent suction ports is 1 cm to 5 cm, and a length at which said plurality of gas spray ports and said plurality of suction ports are set not to be arranged on the straight lines parallel to the substrate transfer direction is not less than 0.2 m.

The stage may include a base which has gas spray holes and suction holes formed at predetermined positions, a first block which has the gas spray ports and is made of a porous member, and a second block which has the suction ports and is made of a porous member, and the first block and the second block are arranged on the base such that the gas spray ports formed in the first block communicate with the gas spray holes formed in the base, and the suction ports formed in the second block communicate with the suction holes formed in the base.

The stage may further include, on a surface, a groove linearly formed for discharging gas sprayed from the gas spray ports to a side surface of the stage, and a longitudinal direction of the groove is preferably shifted from the substrate transfer direction by a predetermined angle. An angle between the longitudinal direction of the groove and the substrate transfer direction is preferably not less than 15° and not more than 90°. Where the stage having a groove includes the base, the first block, and the second block, the first block and the second block may be arranged on the base such that the groove is formed between the first block and the second block.

According to a second aspect of the present invention, there is provided a stage apparatus comprising a stage over which a substrate is to be transferred and a levitation mechanism which levitates the substrate over the stage, wherein the stage includes a plurality of gas spray ports to spray a gas for levitating the substrate, and a linear groove to discharge gas sprayed from the gas spray ports to a side surface of the stage, and said plurality of gas spray ports are set not to be arranged on straight lines parallel to a substrate transfer direction, and a longitudinal direction of the groove is shifted from the substrate transfer direction by a predetermined angle.

The stage apparatus according to the second aspect is preferably arranged such that an interval between the adjacent gas spray ports is 1 cm to 5 cm, and a length at which said plurality of gas spray ports are set not to be arranged on the straight lines parallel to the substrate transfer direction is not less than 0.2 m.

The stage may include a base which has gas spray holes formed at predetermined positions, and a block which has the gas spray ports and is made of a porous member, and the block is arranged on the base such that the gas spray ports formed in the block communicate with the gas spray holes formed in the base, and the groove is formed between the blocks.

An angle between the longitudinal direction of the groove and the substrate transfer direction is preferably not less than 5° and not more than 30°.

According to a third aspect of the present invention, there is provided a coating system which applies a coating liquid to a substrate to form a coating film while transferring the substrate, the system comprising: a stage apparatus which includes a stage over which the substrate is to be transferred and a levitation mechanism which levitates the substrate over the stage; a substrate transfer mechanism which transfers the substrate levitated over the stage; and a coating mechanism which applies the coating liquid to a surface of the substrate to be transferred over the stage by the substrate transfer mechanism, wherein the stage includes a plurality of gas spray ports to spray a gas for levitating the substrate, and a plurality of suction ports to take in air sprayed from the gas spray ports, and said plurality of gas spray ports and said plurality of suction ports are set not to be arranged on straight lines parallel to a substrate transfer direction in a predetermined length along the substrate transfer direction.

According to a fourth aspect of the present invention, there is provided a coating system which applies a coating liquid to a substrate to form a coating film while transferring the substrate, the system comprising: a stage apparatus which includes a stage over which the substrate is to be transferred and a levitation mechanism which levitates the substrate over the stage; a substrate transfer mechanism which transfers the substrate levitated over the stage; and a coating mechanism which applies the coating liquid to a surface of the substrate to be transferred over the stage by the substrate transfer mechanism, wherein the stage includes a plurality of gas spray ports to spray a gas for levitating the substrate, and a linear groove to discharge the gas sprayed from the gas spray ports to a side surface of the stage, and said plurality of gas spray ports are set not to be arranged on straight lines parallel to a substrate transfer direction, and a longitudinal direction of the groove is shifted from the substrate transfer direction by a predetermined angle.

In order to form a coating film, the present invention can suppress formation of printed marks on the coating film which are caused by the gas spray ports, suction ports, and grooves, and form a coating film with high film thickness distribution uniformity.

BEST MODE FOR CARRYING OUT THE INVENTION

An embodiment of the present invention will be described in detail with reference to the accompanying drawing. A case will be described in which the present invention is applied to an apparatus and a method of forming a resist film on the surface of a glass substrate for an LCD (to be described as an "LCD substrate" hereinafter).

Figure 1A:
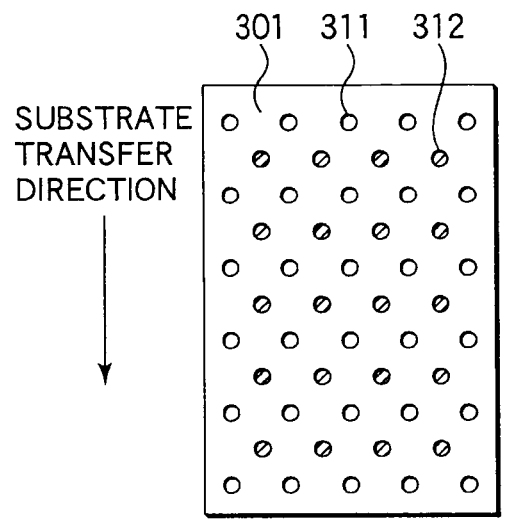
FIG. 1A is a plan view showing an example of the arrangement patterns of gas spray ports and suction ports formed in a stage.
Figure 1B:
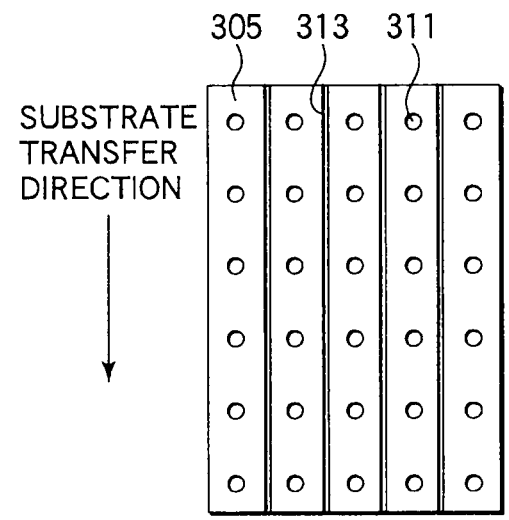
FIG. 1B is a plan view showing another example of the arrangement patterns of the gas spray ports, the suction ports, and grooves formed in the stage.
Figure 2:
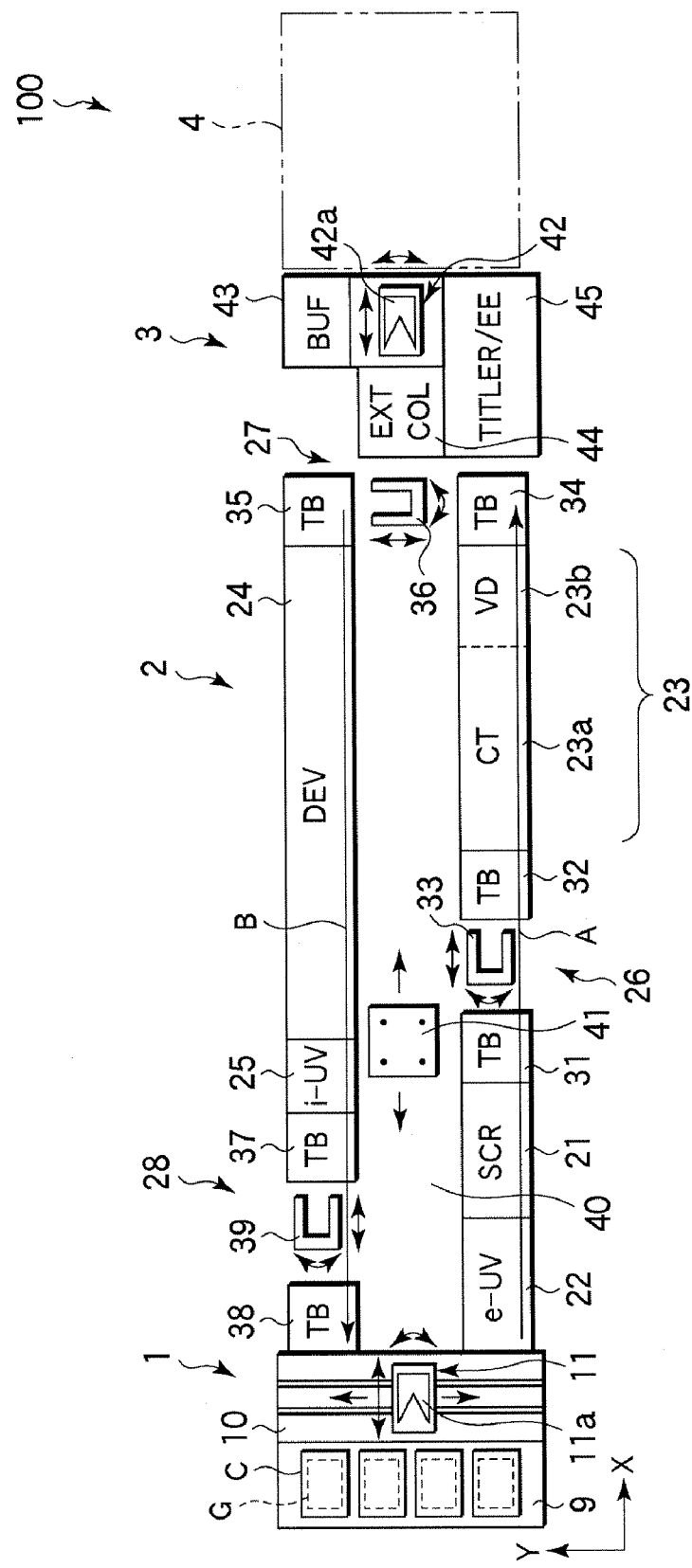
FIG. 2 is a schematic plan view of a resist coating/developing system including a resist coating mechanism according to one embodiment of the present invention.

FIG. 2 is a schematic plan view of a resist coating/developing system including a resist coating unit according to one embodiment of the present invention and configured to form a resist film on an LCD substrate and develop the resist film after light exposure.

The resist coating/developing system 100 comprises a cassette station (loading/unloading portion) 1 on which cassettes C accommodating a plurality of LCD substrates G are placed, a processing station (processing portion) 2 comprising a plurality of processing units to subject the LCD substrate G to a series of processes including resist coating and development, and an interface station (interface portion) 3 to transfer the LCD substrate G with respect to an light exposure apparatus 4. The cassette station 1 and interface station 3 are respectively arranged at the two ends of the processing station 2. In FIG. 2, the longitudinal direction of the resist coating/developing system 100 is defined as an X-direction, and that direction on a plane which is perpendicular to the X-direction is defined as a Y-direction.

The cassette station 1 comprises a stage 9 on which the cassettes C can be placed to line up in the Y-direction, and a transfer apparatus 11 to load/unload the LCD substrate G with respect to the processing station 2. The cassettes C are transferred between the stage 9 and an external system. The transfer apparatus 11 has a transfer arm 11a and can move on a transfer path 10 formed along the Y-direction along which the cassettes C are arranged. The transfer arm 11a transfers the LCD substrate G between the cassettes C and processing station 2.

The processing station 2 has two parallel transfer lines A and B which basically extend in the X-direction to transfer the LCD substrate G. Along the transfer line A, a scrub-cleaning unit (SCR) 21, a first thermal processing unit section 26, a resist coating unit 23, and a second thermal processing unit section 27 are arranged from the cassette station 1 side toward the interface station 3.

Along the transfer line B, the second thermal processing unit section 27, a developing unit (DEV) 24, an i-line UV emitting unit (i-UV) 25, and a third thermal processing unit section 28 are arranged from the interface station 3 side toward the cassette station 1. An excimer UV emitting unit (e-UV) 22 is provided on part of the scrub-cleaning unit 21. The excimer UV emitting unit 22 is provided to remove organic substances on the LCD substrate G prior to scrubber cleaning. The i-line UV emitting unit 25 is provided to decolor the developed substrate G.

In the scrub-cleaning unit 21, the LCD substrate G is cleaned and dried while being transferred in the almost horizontal posture. In the developing unit 24, developing solution coating, rinsing, and drying processes are sequentially performed while transferring the LCD substrate G in the almost horizontal posture. In each of the scrub-cleaning unit 21 and developing unit 24, for example, the LCD substrate G is transferred by roller conveyance or belt conveyance, and a loading port and an unloading port for the LCD substrate G are provided to the opposing short sides. A mechanism similar to the transfer mechanism of the developing unit 24 continuously transfers the LCD substrate G to the i-line UV emitting unit 25.

As will be described later in detail, the resist coating unit 23 comprises a resist coating mechanism (CT) 23a which supplies a resist liquid to form a coating film while transferring the LCD substrate G in the almost horizontal posture, and a reduced pressure drying mechanism (VD) 23b which exposes the LCD substrate G to a reduced pressure atmosphere to vaporize volatile components contained in the coating film formed on the LCD substrate G so as to dry the coating film.

The first thermal processing unit section 26 has two thermal processing unit blocks (TB) 31 and 32 each formed by stacking thermal processing units for thermally processing the LCD substrate G. The thermal processing unit block 31 is provided to the scrub-cleaning unit 21 side, and the thermal processing unit block 32 is provided to the resist coating unit 23 side. A first transfer apparatus 33 is arranged between the two thermal processing unit blocks 31 and 32.

Figure 3:
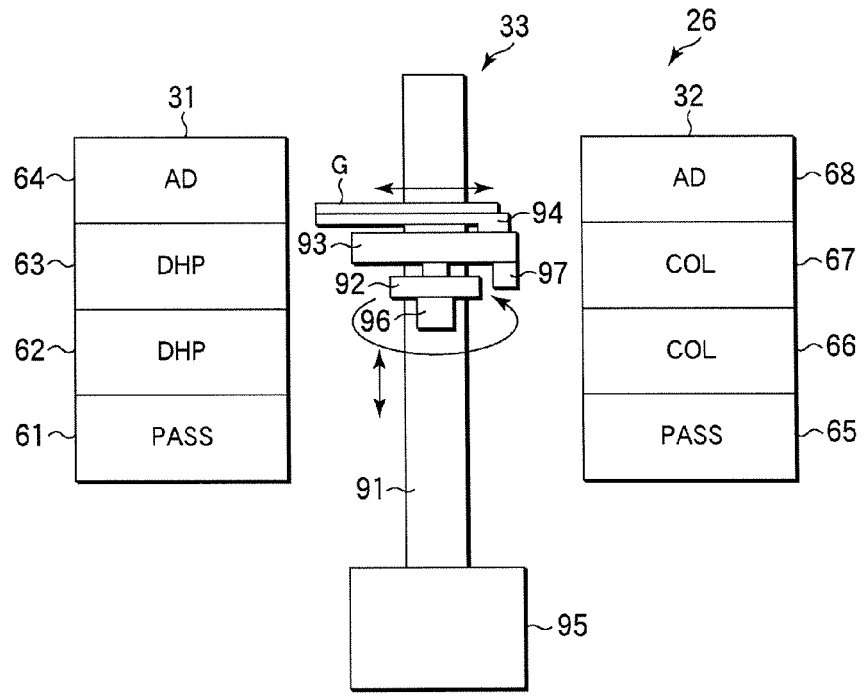
FIG. 3 is a side view showing a first thermal processing unit section in the resist coating/developing system.

As shown in the side view of the first thermal processing unit section 26 of FIG. 3, in the thermal processing unit block 31, a pass unit (PASS) 61 for transferring the LCD substrate G, two dehydration baking units (DHP) 62 and 63 which dehydrate and bake the LCD substrate G, and an adhesion unit (AD) 64 which subjects the LCD substrate G to a hydrophobic process are sequentially stacked upward to form four stages. In the thermal processing unit block 32, a pass unit (PASS) 65 for transferring the LCD substrate G, two cooling units (COL) 66 and 67 which cool the LCD substrate G, and an adhesion unit (AD) 68 which subjects the LCD substrate G to a hydrophobic process are sequentially stacked upward to form four stages.

The first transfer apparatus 33 receives the LCD substrate G from the scrub-cleaning unit 21 via the pass unit 61, transfers the LCD substrate G between the thermal processing units, and transfers the LCD substrate G to the resist coating unit 23 via the pass unit 65.

The first transfer apparatus 33 has a guide rail 91 extending vertically, an elevating member 92 which moves vertically along the guide rail 91, a base member 93 provided to be rotatable on the elevating member 92, and a substrate holding arm 94 provided to be movable forward/backward on the base member 93 and to hold the LCD substrate G. A motor 95 elevates the elevating member 92. A motor 96 rotates the base member 93. A motor 97 moves the substrate holding arm 94 forward/backward. In this manner, the first transfer apparatus 33 is movable vertically and forward/backward, and rotatable, and can access any unit in the thermal processing unit blocks 31 and 32.

The second thermal processing unit section 27 has two thermal processing unit blocks (TB) 34 and 35 each formed by stacking thermal processing units which thermally process the LCD substrate G. The thermal processing unit block 34 is provided to the resist coating unit 23 side, and the thermal processing unit block 35 is provided to the developing unit 24 side. A second transfer apparatus 36 is arranged between the two thermal processing unit blocks 34 and 35.

Figure 4:
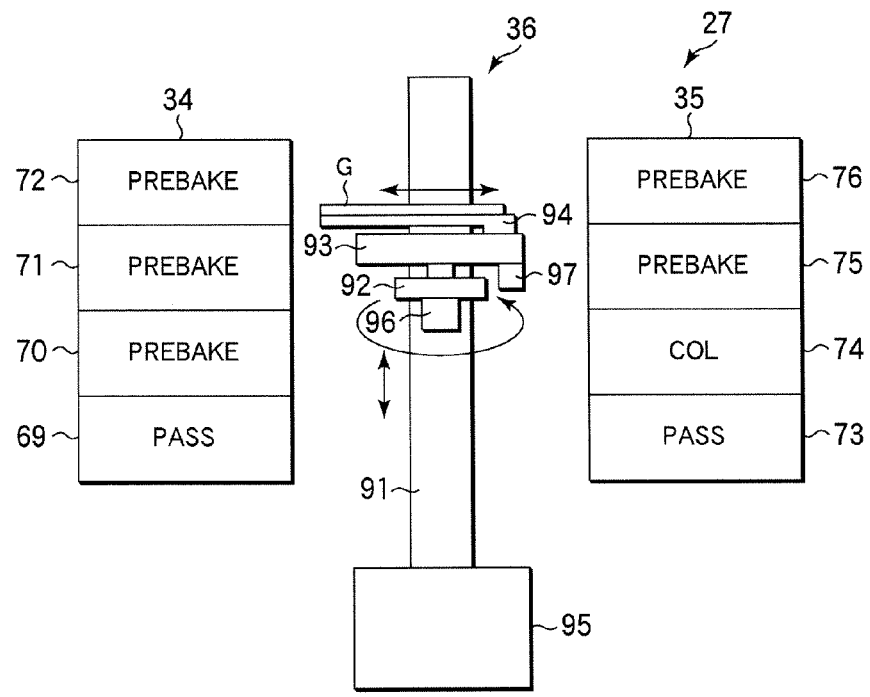
FIG. 4 is a side view showing a second thermal processing unit section in the resist coating/developing system.

As shown in the side view of the second thermal processing unit section 27 of FIG. 4, in the thermal processing unit block 34, a pass unit (PASS) 69 for transferring the LCD substrate G, and three pre-baking units (PREBAKE) 70, 71, and 72 which pre-bake the LCD substrate G are sequentially stacked upward to form four stages. In the thermal processing unit block 35, a pass unit (PASS) 73 for transferring the LCD substrate G, a cooling unit (COL) 74 which cools the LCD substrate G, and two pre-baking units (PREBAKE) 75 and 76 which pre-bake the LCD substrate G are sequentially stacked upward to form four stages.

The second transfer apparatus 36 receives the LCD substrate G from the resist coating unit 23 via the pass unit 69, transfers the LCD substrate G between the thermal processing units, transfers the LCD substrate G to the developing unit 24 via the pass unit 73, and transfers and receives the LCD substrate G with respect to an extension cooling stage (EXT•COL) 44 serving as the substrate transfer portion of the interface station 3 (to be described later). The second transfer apparatus 36 has the same structure as that of the first transfer apparatus 33 and can access any unit of the thermal processing unit blocks 34 and 35.

The third thermal processing unit section 28 has two thermal processing unit blocks (TB) 37 and 38 each formed by stacking thermal processing units which thermally process the LCD substrate G. The thermal processing unit block 37 is provided to the developing unit 24 side, and the thermal processing unit block 38 is provided to the cassette station 1 side. A third transfer apparatus 39 is arranged between the two thermal processing unit blocks 37 and 38.

Figure 5:
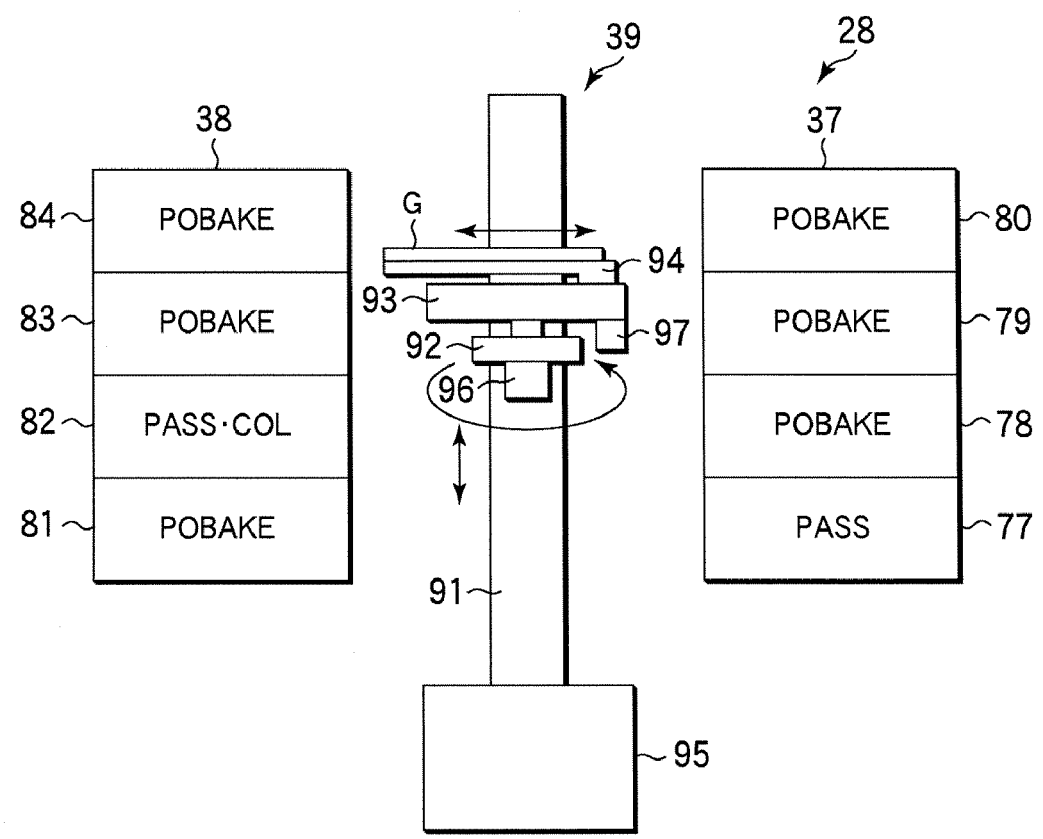
FIG. 5 is a side view showing a third thermal processing unit section in the resist coating/developing system.

As shown in the side view of the third thermal processing unit section 28 of FIG. 5, in the thermal processing unit block 37, a pass unit (PASS) 71 for transferring the LCD substrate G, and three post-baking units (POBAKE) 78, 79, and 80 which post-bake the LCD substrate G are sequentially stacked upward to form four stages. In the thermal processing unit block 38, a post-baking unit (POBAKE) 81 which post-bakes the LCD substrate G, a pass/cooling unit (PASS•COL) 82 for transferring and cooling the LCD substrate G, and two more post-baking units (POBAKE) 83 and 84 are sequentially stacked upward to form four stages.

The third transfer apparatus 39 receives the LCD substrate G from the i-line UV emitting unit 25 via the pass unit 77, transfers the LCD substrate G between the thermal processing units, and transfers the LCD substrate G to the cassette station 1 via the pass/cooling unit 82. The third transfer apparatus 39 also has the same structure as that of the first transfer apparatus 33, and can access any unit of the thermal processing unit blocks 37 and 38.

In the processing station 2, the respective processing units and transfer apparatuses are arranged to constitute the two transfer lines A and B as described above and to basically line up in the processing procedure. Space 40 is provided between the transfer lines A and B. A shuttle (substrate stage member) 41 is provided to be reciprocal through the space 40. The shuttle 41 can hold the LCD substrate G. The LCD substrate G is transferred between the transfer lines A and B via the shuttle 41. The first to third transfer apparatuses 33, 36, and 39 transfer the LCD substrate G with respect to the shuttle 41.

The interface station 3 has a transfer apparatus 42 which transfers the LCD substrate G between the processing station 2 and light exposure apparatus 4, a buffer stage (BUF) 43 where a buffer cassette is arranged, and the extension cooling stage 44 serving as a substrate transfer portion comprising a cooling function. An external unit block 45 in which a titler (TITLER) and a peripheral light exposure unit (EE) are vertically stacked is provided adjacent to the transfer apparatus 42. The transfer apparatus 42 comprises a transfer arm 42a. The transfer arm 42a transfers the LCD substrate G between the processing station 2 and light exposure apparatus 4.

In the resist coating/developing system 100 having the above arrangement, first, an LCD substrate G is transferred by the transfer apparatus 11 directly from a cassette C arranged on the stage 9 of the cassette station 1 into the excimer UV emitting unit 22 of the processing station 2, and subjected to a pre-scrub process. Subsequently, the LCD substrate G is transferred by the transfer apparatus 11 into the scrub-cleaning unit 21, and subjected to scrub-cleaning. After the scrub-cleaning process, the LCD substrate G is unloaded to the pass unit 61 of the thermal processing unit block 31, belonging to the first thermal processing unit section 26, by, e.g., roller conveyance.

The LCD substrate G arranged in the pass unit 61 is initially transferred to any one of the dehydration baking units 62 and 63 of the thermal processing unit block 31 and heated, and subsequently transferred to any one of the cooling units 66 and 67 of the thermal processing unit block 32 and cooled. After that, to fix the resist firmly, the LCD substrate G is transferred to any one of the adhesion unit 64 of the thermal processing unit block 31 and the adhesion unit 68 of the thermal processing unit block 32, and subjected to an adhesion process (hydrophobic process) by HMDS. After that, the LCD substrate G is transferred to any one of the cooling units 66 and 67 and cooled, and then transferred to the pass unit 65 of the thermal processing unit block 32. When performing this series of processes, the first transfer apparatus 33 performs the transfer process of the LCD substrate G entirely.

The LCD substrate G is transferred by a first substrate transfer arm 19a (to be described later) from inside the pass unit 65 into the resist coating unit 23. As will be described later in detail, in the resist coating mechanism 23a, the resist liquid is supplied to the LCD substrate G to form a coating film on it while transferring the LCD substrate G in the horizontal posture. After that, the reduced pressure drying mechanism 23b subjects the coating film to the reduced pressure drying process. Then, the LCD substrate G is transferred by a second substrate transfer arm 19b (to be described later) from the resist coating unit 23 to the pass unit 69 of the thermal processing unit block 34 which belongs to the second thermal processing unit section 27.

The LCD substrate G is transferred by the second transfer apparatus 36 from inside the pass unit 69 to any one of the pre-baking units 70, 71, and 72 of the thermal processing unit block 34 or any one of the pre-baking units 75 and 76 of the thermal processing unit block 35 and pre-baked. After that, the LCD substrate G is transferred to the cooling unit 74 of the thermal processing unit block 35 and cooled to a predetermined temperature. Then, the LCD substrate G is further transferred by the second transfer apparatus 36 to the pass unit 73 of the thermal processing unit block 35.

After that, the LCD substrate G is transferred by the second transfer apparatus 36 to the extension cooling stage 44 of the interface station 3. Where necessary, the LCD substrate G is transferred by the transfer apparatus 42 of the interface station 3 to the peripheral light exposure unit (EE) of the external unit block 45, and subjected to light exposure to remove the peripheral portion (unnecessary portion) of the resist film. Subsequently, the LCD substrate G is transferred by the transfer apparatus 42 to the light exposure apparatus 4, and the resist film on the LCD substrate G is subjected to light exposure with a predetermined pattern. The LCD substrate G may be temporarily accommodated in a buffer cassette on the buffer stage 43 and then transferred to the light exposure apparatus 4.

After the light exposure, the LCD substrate G is transferred by the transfer apparatus 42 of the interface station 3 into the titler (TITLER) on the upper stage of the external unit block 45 to record predetermined information on the LCD substrate G. Then, the LCD substrate G is transferred by the transfer apparatus 42 onto the extension cooling stage 44. Then, the LCD substrate G is transferred by the second transfer apparatus 36 from the extension cooling stage 44 to the pass unit 73 of the thermal processing unit block 35 which belongs to the second thermal processing unit section 27.

The LCD substrate G is transferred from the pass unit 73 to the developing unit 24 by, e.g., a roller conveyer mechanism extending from the pass unit 73 to the developing unit 24. In the developing unit 24, a developing solution is applied to the LCD substrate G while the substrate is being transferred in the horizontal posture. Then, the LCD substrate G is temporarily stopped and tilted by a predetermined angle to drop the developing solution from it. In this state, a rinsing solution is supplied to the LCD substrate G to clean off the developing solution. After that, the LCD substrate G is restored to the horizontal posture, and transfer is started again. Drying nitrogen gas or air is blown to the LCD substrate G to dry it.

After the developing process is ended, the LCD substrate G is transferred by a transfer mechanism, e.g., roller conveyer, continuous from the developing unit 24, to the i-line UV emitting unit 25, and subjected to a decoloring process. After that, the LCD substrate G is transferred by a roller conveyer mechanism in the i-line UV emitting unit 25 to the pass unit 77 of the thermal processing unit block 37 which belongs to the third thermal processing unit section 28.

Then, the LCD substrate G is transferred by the third transfer apparatus 39 from inside the pass unit 77 to any one of the post-baking units 78, 79, and 80 of the thermal processing unit block 37 or any one of the post-baking units 81, 83, and 84 of the thermal processing unit block 38 and post-baked. After that, the LCD substrate G is transferred to the pass/cooling unit 82 of the thermal processing unit block 38 and cooled to a predetermined temperature. Then, the LCD substrate G is accommodated into a predetermined cassettes C arranged on the cassette station 1 by the transfer apparatus 11 of the cassette station 1.

The resist coating unit 23 will now be described in detail.

Figure 6:
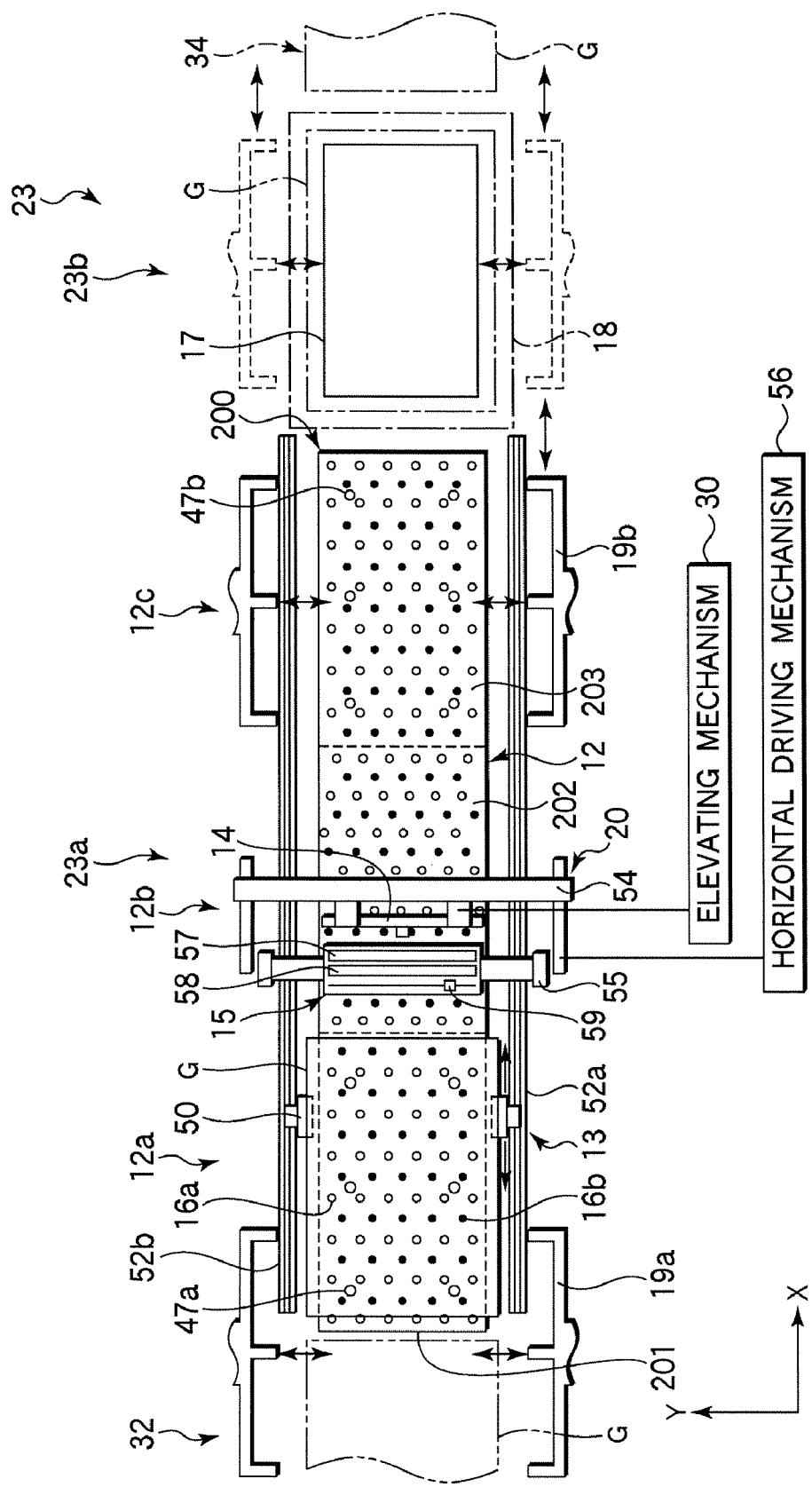
FIG. 6 is a schematic plan view showing the resist coating unit included in the resist coating/developing system.

FIG. 6 is a schematic plan view showing the resist coating unit 23. The resist coating unit 23 comprises the resist coating mechanism (CT) 23a and the reduced pressure drying mechanism (VD) 23b.

The resist coating mechanism 23a comprises a stage apparatus 12 which has a stage 200 to transfer the LCD substrate G by levitation, a substrate transfer mechanism 13 which transfers the LCD substrate G on the stage apparatus 12 in the X-direction, a resist supply nozzle 14 which supplies the resist liquid onto the surface of the LCD substrate G under transfer over the stage 200 by levitation, and a nozzle cleaning unit 15 to clean the resist supply nozzle 14. To transfer the LCD substrate G from the pass unit 65 provided to the thermal processing unit block 32 to the resist coating mechanism 23a, the first substrate transfer arm 19a is disposed to be reciprocal between the pass unit 65 and resist coating unit 23. The first substrate transfer arm 19a is movable not only in the X-direction but also in the Y-direction and Z direction (vertical direction).

The reduced pressure drying mechanism 23b comprises a stage 17 where the LCD substrate G is to be placed, and a chamber 18 for accommodating the stage 17 and the LCD substrate G placed on the stage 17. To transfer via the reduced pressure drying mechanism 23b the LCD substrate G from the resist coating mechanism 23a to the pass unit 69 provided to the thermal processing unit block 34, the second substrate transfer arm 19b is disposed to be reciprocal between the resist coating unit 23 and pass unit 69. The second substrate transfer arm 19b is also movable not only in the X-direction but also in the Y-direction and Z direction.

The stage apparatus 12 is roughly divided into an introduction portion 12a, a coating portion 12b, and an unloading portion 12c from upstream to downstream in the transfer direction of the LCD substrate G. The introduction portion 12a is an area to transfer the LCD substrate G from the pass unit 65 of the thermal processing unit block 32 to the coating portion 12b. The resist nozzle 14 is arranged in the coating portion 12b. On the coating portion 12b, the resist liquid is supplied to the LCD substrate G to form a coating film on it. The unloading portion 12c is an area to unload the LCD substrate G having the coating film formed on it to the reduced pressure drying mechanism 23b.

As shown in FIG. 6, the stage 200 provided to the stage apparatus 12 has three small stages 201, 202, and 203 arranged in the X-direction. These small stages are respectively arranged in the introduction portion 12a, coating portion 12b, and unloading portion 12c.

The stage 200 has a large number of gas spray ports 16a to spray a predetermined gas (e.g., air or nitrogen gas) upward (in the Z direction), and a large number of suction ports 16b to take in air.

In the stage 200, each of the small stages 201 and 203 respectively arranged on the introduction portion 12a and unloading portion 12c has an arrangement in which the large number of gas spray ports 16a and suction ports 16b are alternately formed to be arranged on straight lines at predetermined pitches in the X- and Y-directions. By balancing the amount of gas sprayed from the gas spray ports 16a with the amount of air taken in from the suction ports 16b (namely, by setting the pressure load constant), the LCD substrate G is levitated at a predetermined height from the surfaces of the small stages 201 and 203. The LCD substrate G can be transferred by levitation while holding the Y-direction end of the LCD substrate G, which is levitated in this manner, by the substrate transfer mechanism 13, and moving the LCD substrate G in the X-direction.

The resist film is not formed in the introduction portion 12a, and the resist film on the LCD substrate G loaded to the unloading portion 12c is almost dried. Accordingly, since no printed mark is formed on the introduction portion 12a and unloading portion 12c, the printed mark on the resist film need not be considered in the introduction portion 12a and unloading portion 12c. In FIG. 6, the gas spray ports 16a are expressed as white dots and the suction ports 16b are expressed as black dots to facilitate understanding of the arrangement of the gas spray ports 16a and suction ports 16b. FIG. 6 shows only some of the gas spray ports 16a and suction ports 16b to make the arrangement clear.

Figure 7:
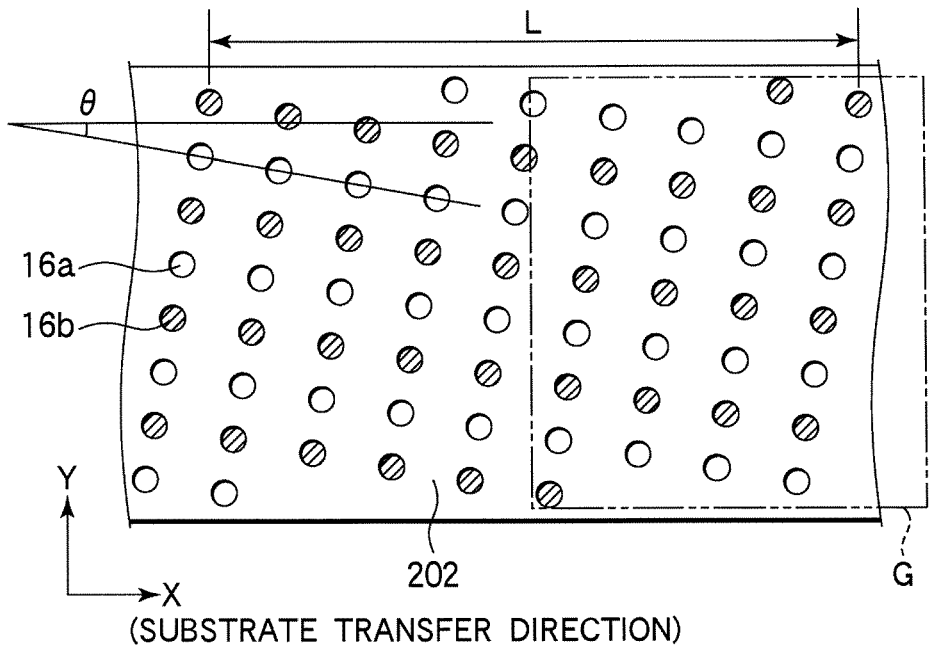
FIG. 7 is a schematic plan view showing a small stage provided to a stage apparatus in the resist coating unit shown in FIG. 6.

As shown in an enlarged plan view of FIG. 7, in the stage 200, the gas spray ports 16a and suction ports 16b formed in the small stage 202 in the coating portion 12b are set not to be arranged on straight lines in the X-direction in a predetermined length L in the X-direction serving as the substrate transfer direction. With this arrangement, the number of times of passing of all portions of the LCD substrate G over the gas spray ports 16a (or suction ports 16b) becomes almost constant, thus suppressing formation of the striped printed marks.

More specifically, it is preferable that the length L at which the gas spray ports 16a and suction ports 16b are not arranged on straight lines parallel to the substrate transfer direction is 0.2 m or more where the interval between the adjacent gas spray ports 16a is 1 cm to 5 cm and the interval between the adjacent suction ports 16b is also 1 cm to 5 cm. The interval between the adjacent gas spray ports 16a and the interval between the adjacent suction ports 16b may be smaller than 1 cm, but this undesirably increases the process cost. The levitation precision of the LCD substrate G can be satisfactorily ensured even where the interval is 1 cm or more. However, where the interval is larger than 5 cm, the flatness of the LCD substrate G becomes poor. Where the gas spray ports 16a and suction ports 16b are linearly arranged in a direction shifting from the X-direction by an angle $\theta$ as shown in FIG. 7, the angle $\theta$ is preferably 15° to 90° (both inclusive). Where the angle $\theta$ is 15°, the striped printed marks are slightly formed, but can be negligible as a product.

Figure 8:
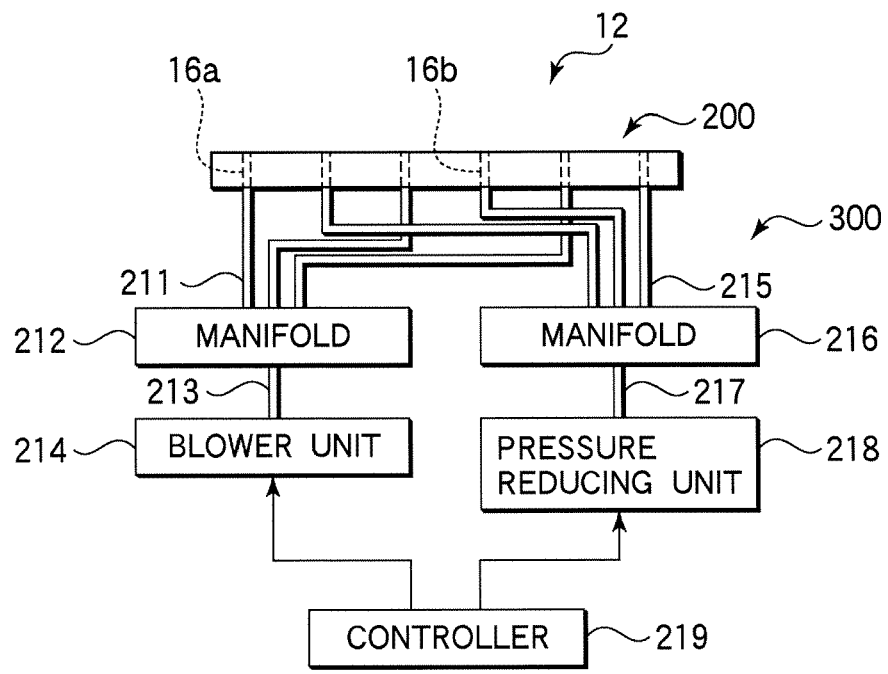
FIG. 8 is a schematic view showing a levitation mechanism provided to the stage apparatus in the resist coating unit shown in FIG. 6.

As shown in FIG. 8, a levitation mechanism 300 is arranged under the stage 200. The levitation mechanism 300 includes branch pipes 211, a manifold 212, a blower unit 213, branch pipes 215, a manifold 126, a pressure reducing unit 218, and a controller 219. The branch pipes 211 communicate with the predetermined number of gas spray ports 16a formed in the stage 200. The manifold 212 is attached to allow the plurality of branch pipes 211 to communicate with each other. The blower unit 214 is attached to the manifold 212 through a blower pipe 213, and functions as a gas spray mechanism. The branch pipes 215 communicate with the predetermined number of gas spray ports 16*b* formed in the stage 200. The manifold 216 is attached to allow the plurality of branch pipes 215 to communicate with each other. The pressure reducing unit 218 is attached to the manifold 216 through a main blower pipe 217. The controller 219 controls the blowing amount of the blower unit 214 and the suction amount of the pressure reducing unit 218, and controls the gas spray pressure from the gas spray ports 16*a* and the suction pressure of the suction ports 16*b*. When the controller 219 controls the gas spray pressure from the gas spray ports 16*a* and the suction pressure of the suction ports 16*b*, the levitation height and levitation posture of the substrate G are controlled, and the substrate is held in an almost horizontal posture at a predetermined height. A blower, gas cylinder, or factory gas pipe facility can be used as the blower unit 214, and an aspirator or vacuum pump can be used as the pressure reducing unit 218.

On the small stage 201 formed on the introduction portion 12*a*, lift pins 47*a* are arranged to support the LCD substrate G transferred by the first substrate transfer arm 19*a* to the introduction portion 12*a* and to move the LCD substrate G downward to the small stage 201. On the small stage 203 on the unloading portion 12*c*, lift pins 47*b* are arranged to lift the LCD substrate G transferred to the unloading portion 12*c* and to transfer the LCD substrate G to the second substrate transfer arm 19*b*.

The substrate transfer mechanism 13 comprises linear guides 52*a* and 52*b* which are arranged to extend in the X-direction on the side surfaces of the stage 200, a slider 50 which fits with the linear guides 52*a* and 52*b*, an X axis driving mechanism (not shown), e.g., a belt driving mechanism or an air slider, to reciprocally move the slider 50 in the X-direction, and a substrate holding member (not shown), e.g., a suction pad, which is provided to the slider 50 to hold part of the Y-direction end of the LCD substrate G. For example, the suction pad holds the LCD substrate G in the vicinity of that Y-direction end of the lower surface of the LCD substrate G to which the resist liquid is not applied.

The resist nozzle 14 has an elongated shape which is long in one direction and discharges the resist liquid in the form of an almost band like shape which is long in the Y-direction. A nozzle moving mechanism 20 comprises an elevating mechanism 30 which holds the resist nozzle 14 such that its longitudinal direction coincides with the Y-direction and vertically moves the resist nozzle 14 in the Z direction, a pillar member 54 which holds the elevating mechanism 30, and a horizontal driving mechanism 56, e.g., a ball screw, to move the pillar member 54 in the X-direction. The nozzle moving mechanism 20 can move the resist nozzle 14 between a position to supply the resist liquid to the LCD substrate G and positions, e.g., a position where the LCD substrate G is to be cleaned in the nozzle cleaning unit 15.

The nozzle cleaning unit 15 is attached to a pillar member 55 and arranged above the small stage 202. The nozzle cleaning unit 15 comprises a dummy dispenser portion 57 to perform so called dummy dispensing which causes the resist nozzle 14 to preliminarily discharge the resist liquid before supplying the resist liquid to the LCD substrate G, a nozzle bath 58 to hold a resist discharge port in a vapor atmosphere of a solvent (e.g., a thinner) so the resist discharge port of the resist nozzle 14 will not be dried, and a nozzle cleaning mechanism 59 to remove the resist attaching to the vicinity of the resist discharge port of the resist nozzle 14.

The stage 17 provided to the reduced pressure drying mechanism 23*b* is provided with proximity pins (not shown), which support the LCD substrate G, at predetermined positions on its surface. The chamber 18 has a two split structure comprising a fixed lower container and a vertically movable upper lid.

A process for the LCD substrate G in the resist coating unit 23 having the above arrangement will be described.

First, the slider 50 is set standby at a predetermined position (e.g., the thermal processing unit block 32 side) of the introduction portion 12*a*. The LCD substrate G can be levitated at a predetermined height at the respective portions of the stage 200. Subsequently, the LCD substrate G is held and transferred by the first substrate transfer arm 19*a* into the introduction portion 12*a* from the pass unit 65 provided to the thermal processing unit block 32. The lift pins 47*a* are moved upward to transfer the LCD substrate G from the first substrate transfer arm 19*a* to the lift pins 47*a*, and moved downward to transfer the LCD substrate G to the slider 50. Thus, the LCD substrate G is held by levitation in an almost horizontal posture over the small stage 201.

When sliding the slider 50 toward the unloading portion 12*c* side at a predetermined speed, as the LCD substrate G levitated and transferred over the small stage 202 in the coating portion 12*b* passes under the resist nozzle 14, the resist nozzle 14 supplies the resist liquid to the surface of the LCD substrate G to form a coating film. Regarding the height to arrange the resist nozzle 14, as the LCD substrates G are usually transferred in practically the same state, the height of the resist nozzle 14 is adjusted in accordance with the LCD substrate G to be processed first, or a dummy substrate, and this position is stored in the control device of the elevating mechanism 30. The discharge start/end timing of the resist liquid from the resist nozzle 14 is determined utilizing a measurement signal of a sensor that detects the position of the LCD substrate G.

The LCD substrate G on which the coating film is formed is transferred to the unloading portion 12*c*. The slider 50 releases the LCD substrate G, and the lift pins 47*b* are moved upward. Subsequently, the second substrate transfer arm 19*b* accesses the LCD substrate G lifted by the lift pins 47*b*. When the second substrate transfer arm 19*b* holds the LCD substrate G at the Y-direction ends of the LCD substrate G, the lift pins 47*b* are moved downward.

The second substrate transfer arm 19*b* places the held LCD substrate G onto the stage 17 of the reduced pressure drying mechanism 23*b*. After that, the chamber 18 is closed hermetically and its interior is pressure reduced to dry the coating film by pressure reduction. The slider 50 that has transferred the LCD substrate G to the lift pins 47*b* is returned to the thermal processing unit block 32 side to transfer an LCD substrate G to be processed next.

When the reduced pressure drying mechanism 23*b* ends the process for the LCD substrate G, the chamber 18 is opened. The second substrate transfer arm 19*b* accesses the LCD substrate G placed on the stage 17 and holds the LCD substrate G. The second substrate transfer arm 19*b* then transfers the LCD substrate G to the pass unit 69 of the thermal processing unit block 34.

After that, transfer of the LCD substrate G is repeated in the manner as described above to form the coating film on the LCD substrate G. During this period of time, the cleaning process of the resist nozzle 14 is performed appropriately as part of one set including, e.g., dummy dispensing by the dummy dispenser portion 57, formation of the resist film on the LCD substrate G, the cleaning process for the resist nozzle 14 by the nozzle cleaning mechanism 59, and suppression of drying of the resist discharge port by the nozzle bath 58.

Another example of the small stage arranged on the coating portion 12b will be described next.

Figure 9:
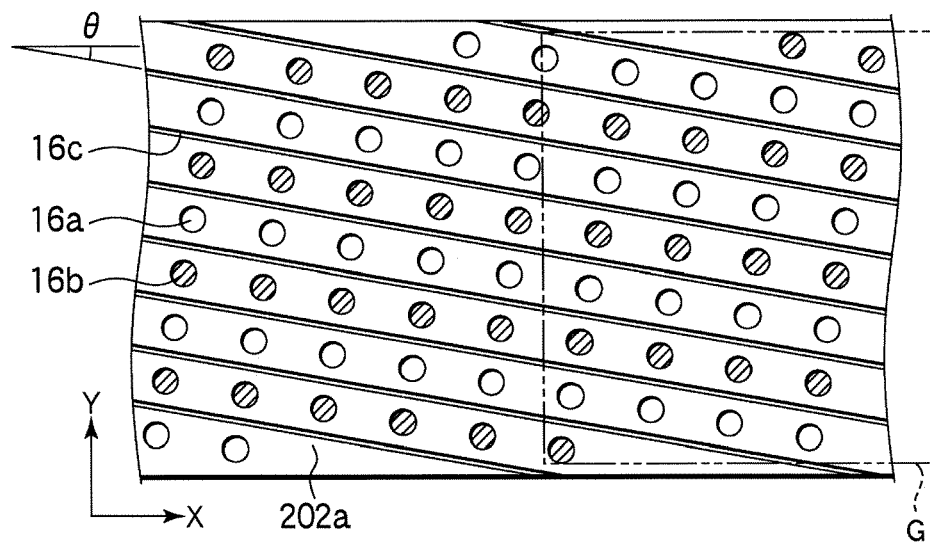
FIG. 9 is a schematic plan view showing another example of the small stage provided to the stage apparatus in the resist coating unit shown in FIG. 6.
Figure 10:
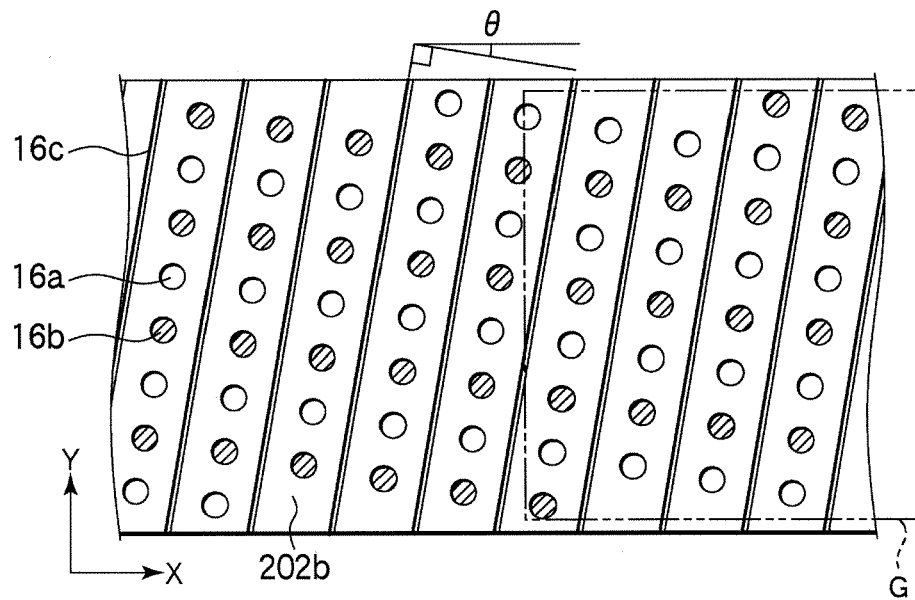
FIG. 10 is a schematic plan view showing still another example of the small stage provided to the stage apparatus in the resist coating unit shown in FIG. 6.

Each of small stages 202a and 202b shown in FIGS. 9 and 10 has a structure in which linear grooves 16c for discharging gas sprayed from the gas spray ports 16a to the side surface of the small stage 202a are formed on the surface of the small stage 202 shown in FIGS. 6 and 7. Where the gas spray ports 16a and suction ports 16b are formed on the straight lines in a direction shifting from the X-direction by an angle θ, the grooves 16c may extend in the direction shifting by the angle θ, as shown in FIG. 9, or in the direction perpendicular to the direction shifting by the angle θ, as shown in FIG. 10.

Figure 11:
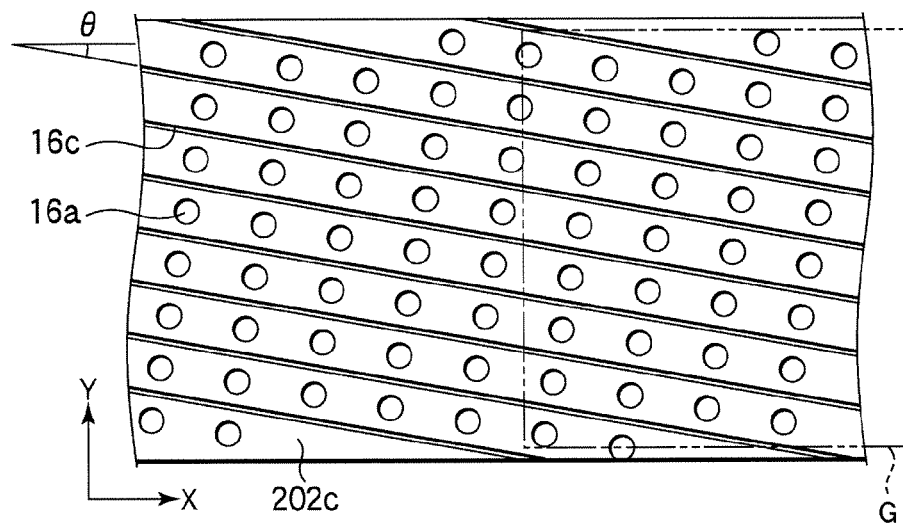
FIG. 11 is a schematic plan view showing still another example of the small stage provided to the stage apparatus in the resist coating unit shown in FIG. 6.
Figure 12:
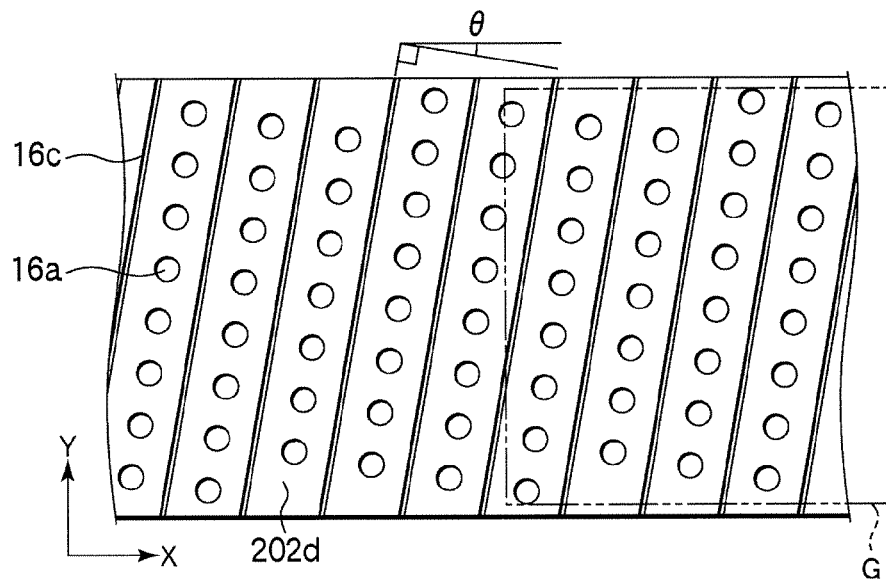
FIG. 12 is a schematic plan view showing still another example of the small stage provided to the stage apparatus in the resist coating unit shown in FIG. 6.

A small stage 202c without any suction port 16b shown in FIG. 11 is modified from the small stage 202a shown in FIG. 9. Similarly, a small stage 202d without any suction port 16b shown in FIG. 12 is modified from the small stage 202b shown in FIG. 10. On each of the small stages 202a and 202b shown in FIGS. 9 and 10, the gas amount to be discharged from the space between the small stage 202a or 202b and the LCD substrate G is adjusted based on the total sum of the suction amount from the suction ports 16b and the gas amount to be discharged from the grooves 16c to the side surface of the small stage 202a or 202b. However, on each of the small stages 202c and 202d shown in FIGS. 11 and 12, the gas amount to be discharged from the space between the small stage 202c or 202d and the LCD substrate G is adjusted based on the gas amount to be discharged from the grooves 16c to the side surface of the small stage 202c or 202d.

Figure 13:
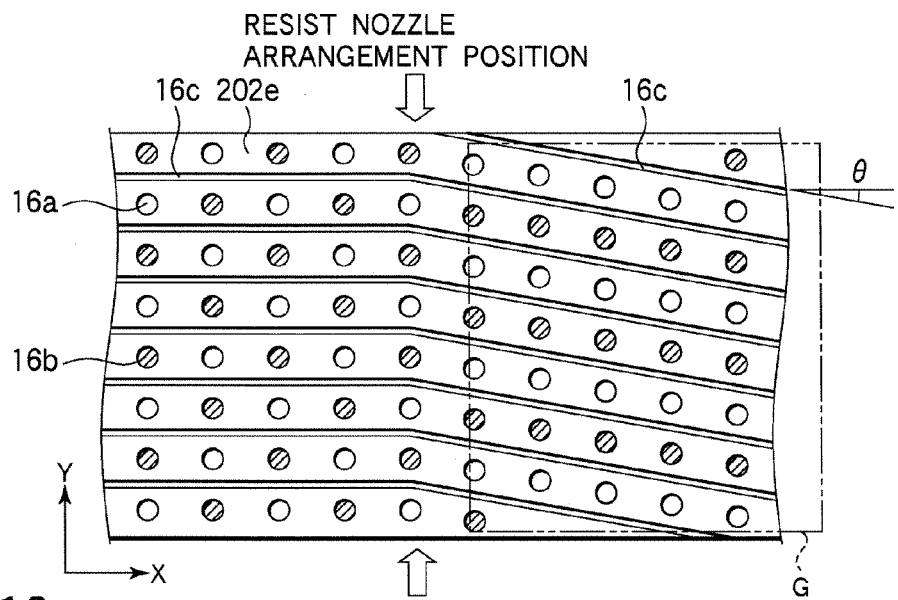
FIG. 13 is a schematic plan view showing still another example of the small stage provided to the stage apparatus in the resist coating unit shown in FIG. 6.

A small stage 202e shown in FIG. 13 is modified from the small stage 202a shown in FIG. 9, and the downstream side of the small stage 202e in the substrate transfer direction with respect to the arrangement position of the resist nozzle 14 has the same structure as that of the small stage 202a. However, the upstream side of the small stage 202e in the substrate transfer direction with respect to the arrangement position of the resist nozzle 14 has a structure in which the gas spray ports 16a, suction ports 16b, and grooves 16c are arranged on the straight lines to be parallel to the substrate transfer direction.

Since the printed mark is formed on the resist film based on a temperature distribution on the LCD substrate G caused by a gas flow for levitating the LCD substrate G before drying the LCD substrate G coated with the resist liquid, the printed mark is not formed on the resist film even if the gas spray ports 16a and the like are arranged as shown in FIG. 13 before coating the LCD substrate with the resist liquid. Such structure of the small stage 202e can be applied to the small stages 202, 202b, 202c, and 202d.

Figure 14A:
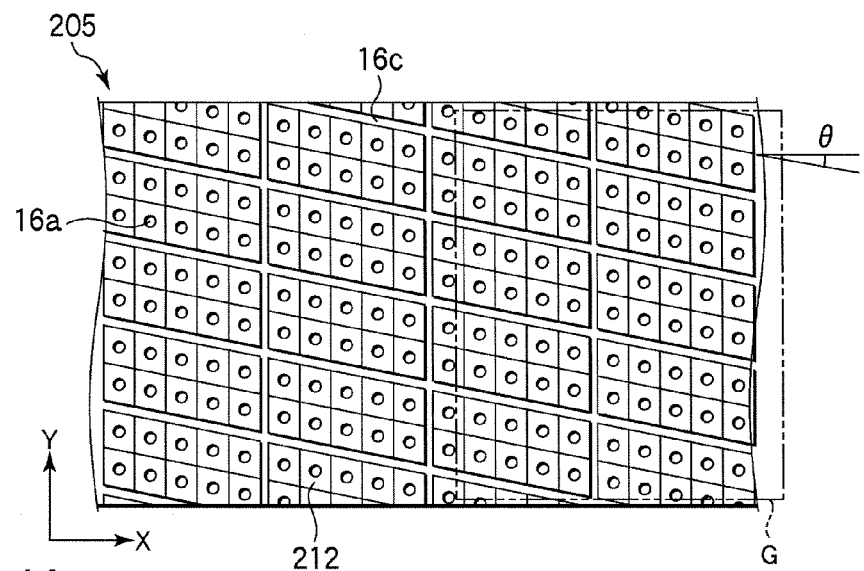
FIG. 14A is a schematic plan view showing still another example of the small stage provided to the stage apparatus in the resist coating unit shown in FIG. 6.
Figure 14B:
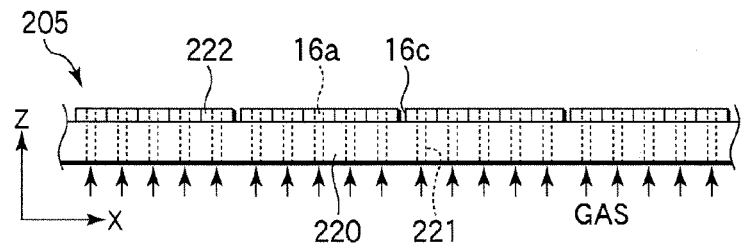
FIG. 14B is a schematic side view of the stage apparatus shown in FIG. 14A.

FIGS. 14A and 14B are a schematic plan view and a schematic side view, respectively, showing still another example of the small stage. A small stage 205 has a structure in which blocks 222 each of which has the gas spray ports 16a and is made of a porous material are arranged on a base 220 having gas spray holes 221 at predetermined positions, such that the gas spray ports 16a formed in the block 222 communicate with the gas spray holes 221 formed in the base 220, and the grooves 16c are formed between the blocks 222.

By using the blocks 222 made of the porous material, gas is sprayed not only from the gas spray ports 16a but also from their vicinities. Accordingly, the LCD substrate G can be prevented from being locally bent by the gas spray pressure, and the horizontality of the LCD substrate G can be improved. Note that the gas spray ports 16a are arranged on the straight lines parallel to the Y-direction, and are arranged on the straight lines parallel to a direction shifting from the X-direction by an angle θ. Hence, similar to the small stage 202 and the like, formation of the printed mark on the resist film can be suppressed.

Figure 15A:
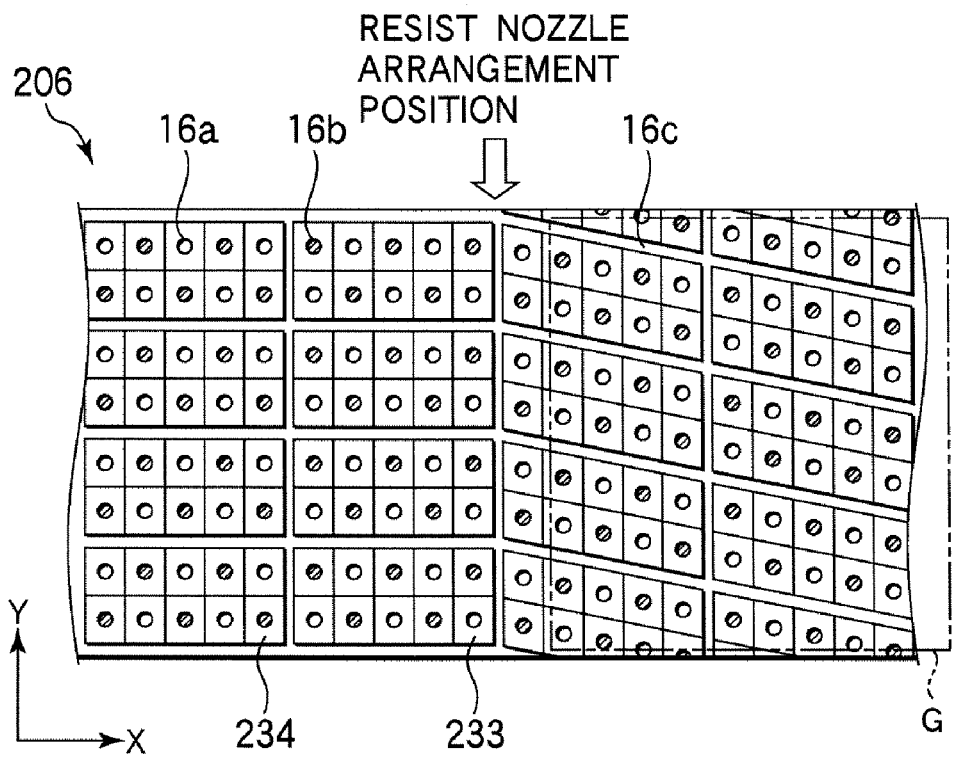
FIG. 15A is a schematic plan view showing still another example of the small stage provided to the stage apparatus in the resist coating unit shown in FIG. 6.
Figure 15B:
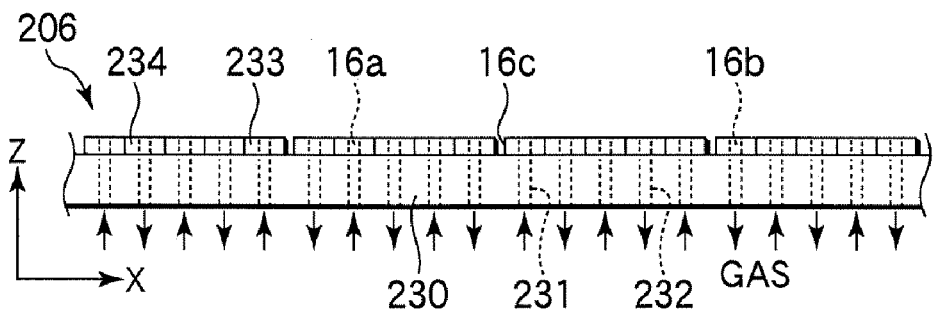
FIG. 15B is a schematic side view of the stage apparatus shown in FIG. 15A.

FIGS. 15A and 15B are a schematic plan view and a schematic side view, respectively, showing still another example of the small stage. A small stage 206 includes a base 230 having gas spray holes 231 and suction holes 232 at predetermined positions, a first block 233 which has the gas spray ports 16a and is made of the porous material, and a second block 234 which has the suction ports 16b and is made of the porous material. The small stage 206 also has a structure in which the first blocks 233 and the second blocks 234 are arranged on the base 230 as follows. The gas spray ports 16a formed in the first block 233 communicate with the gas spray holes 231 formed in the base 230. The suction ports 16b formed in the second block 234 communicate with the suction holes 232 formed in the base 230.

Similar to the small stage 205, the small stage 206 also uses the first and second blocks 233 and 234 made of the porous material, thereby suppressing local bending of the LCD substrate G caused by the gas spray pressure and gas suction pressure. As a result, the horizontality of the entire LCD substrate G can be improved, and formation of printed marks can be suppressed. Note that since the supplied/discharged gas amount is adjusted by the base 230, the first and second blocks 233 and 234 respectively have different functions, but have identical structures.

The small stages 205 and 206 can be modified similar to the case of the small stage 202e which is modified from the small stage 202a. The extending direction of the grooves 16c formed in the small stage 205 or 206 may be the same as that formed in the small stage 202b or 202d as shown in FIG. 10 or 12.

FIGS. 7 to 15B are views each showing the small stage of the coating portion 12b. However, since the resist film on the LCD substrate G is not completely dried on the unloading portion 12c, the small stage in the unloading portion 12c may be continued to the small stage in the coating portion 12b, as a matter of course. Accordingly, the possibility of formation of the striped printed mark can be decreased. The small stage 201 or 203 need not have the suction ports 16b because the stage 201 or 203 need not keep high levitation precision of the LCD substrate G as the small stage 202. The suction ports 16b need not be formed. The apparatus structure can be simplified without forming the suction holes 16b, thereby reducing the apparatus cost and improving the reliability of the apparatus. For example, when a failure occurs in a suction system, the levitation precision of the LCD substrate G excessively decreases. However, where the suction system is not formed, such trouble does not occur.

The present invention is not limited to the above embodiments but can be changed in various manners. For example, in the above embodiment, the gas spray ports 16a and suction ports 16b are not arranged on the straight lines in the substrate transfer direction on the small stage of the coating portion 12b. However, the introduction portion 12a and unloading portion 12c may have the same arrangement. In the above embodiment, a resist film was employed as the coating film. However, the coating film is not limited to a resist film, but can be an anti-reflection film, a non-photosensitive insulating film, or the like.

INDUSTRIAL APPLICABILITY

The present invention is suitably applied to a resist film formation apparatus or the like which forms a coating film such as a resist film on a large substrate such as an LCD glass substrate.

The invention claimed is:

1. A stage apparatus comprising:
   a stage over which a substrate is to be transferred; and
   a levitation mechanism which levitates the substrate over the stage,
   wherein the stage includes a group of gas spray ports to spray a gas to levitate the substrate, and a group of suction ports to take in air sprayed from the gas spray ports, and
   wherein each of the group of gas spray ports and the group of suction ports are linearly arrayed with a predetermined interval between adjacent ports in an array direction shifted from a substrate transfer direction by a predetermined angle, such that, within each of the groups, no two adjacent ports are aligned on a straight line parallel to the substrate transfer direction in a predetermined length along the substrate transfer direction.

2. The stage apparatus according to claim 1, wherein the gas spray ports within the group of gas spray ports are arrayed with an interval of 1 cm to 5 cm between adjacent gas spray ports,
   wherein the suction ports within the group of suction ports are arrayed with an interval of 1 cm to 5 cm between adjacent suction ports, and
   wherein the predetermined length is not less than 0.2 m.

3. The stage apparatus according to claim 1, wherein the stage includes
   a base which has gas spray holes and suction holes formed at predetermined positions,
   a first block which has the gas spray ports and includes a porous material, and
   a second block which has the suction ports and includes a porous material, and
   wherein the first block and the second block are arranged on the base such that the gas spray ports formed in the first block communicate with the gas spray holes formed in the base, and the suction ports formed in the second block communicate with the suction holes formed in the base.

4. The stage apparatus according to claim 1, wherein the stage includes, on a surface, grooves linearly formed to discharge gas sprayed from the gas spray ports to a side surface of the stage, and
   wherein the grooves extend in a first longitudinal direction that is parallel to the array direction or in a second longitudinal direction that is perpendicular to the array direction.

5. The stage apparatus according to claim 4, wherein the stage further includes
   a base which has gas spray holes and suction holes formed at predetermined positions,
   a first block which has the gas spray ports and includes a porous material, and
   a second block which has the suction ports and includes a porous material, and
   wherein the first block and the second block are arranged on the base such that the gas spray ports formed in the first block communicate with the gas spray holes formed in the base, the suction ports formed in the second block communicate with the suction holes formed in the base, and the grooves are formed between the first block and the second block.

6. The stage apparatus according to claim 1, wherein the predetermined angle is an angle not less than 15° and not more than 90°.

7. A stage apparatus comprising:
   a stage over which a substrate is to be transferred; and
   a levitation mechanism which levitates the substrate over the stage,
   wherein the stage includes a group of gas spray ports to spray a gas to levitate the substrate, and linear grooves to discharge gas sprayed from the gas spray ports to a side surface of the stage,
   wherein the group of gas spray ports are linearly arrayed with a predetermined interval between adjacent ports in an array direction shifted from a substrate transfer direction by a predetermined angle, such that, within the group of gas spray ports, no two adjacent ports are aligned on a straight line parallel to the substrate transfer direction in a predetermined length along the substrate transfer direction, and
   wherein the grooves extend in a first longitudinal direction that is parallel to the array direction or in a second longitudinal direction that is perpendicular to the array direction.

8. The stage apparatus according to claim 7, wherein the gas spray ports within the group of gas spray ports are arrayed with an interval of 1 cm to 5 cm between adjacent gas spray ports, and
   wherein the predetermined length is not less than 0.2 m.

9. The stage apparatus according to claim 7, wherein the stage includes
   a base which has gas spray holes formed at predetermined positions, and
   a block which has the gas spray ports and includes a porous material, and
   wherein the block is arranged on the base such that the gas spray ports formed in the block communicate with the gas spray holes formed in the base, and the grooves are formed between the blocks.

10. The stage apparatus according to claim 7, wherein the predetermined angle is an angle not less than 15° and not more than 90°.

11. A coating system which applies a coating liquid to a substrate to form a coating film while transferring the substrate, the system comprising:
    a stage apparatus which includes
       a stage over which the substrate is to be transferred, and
       a levitation mechanism which levitates the substrate over the stage;
    a substrate transfer mechanism which transfers the substrate levitated over the stage; and
    a coating mechanism which applies the coating liquid to a surface of the substrate transferred over the stage by the substrate transfer mechanism,
    wherein the stage includes a group of gas spray ports to spray a gas to levitate the substrate, and a group of suction ports to take in air sprayed from the gas spray ports, and
    wherein each of the group of gas spray ports and the group of suction ports are linearly arrayed with a predetermined interval between adjacent ports in an array direction shifted from a substrate transfer direction by a predetermined angle, such that, within each of the groups, no two adjacent ports are aligned on a straight line parallel to the substrate transfer direction in a predetermined length along the substrate transfer direction.

12. A coating system which applies a coating liquid to a substrate to form a coating film while transferring the substrate, the system comprising:
- a stage apparatus which includes a stage over which the substrate is to be transferred and a levitation mechanism which levitates the substrate over the stage;
- a substrate transfer mechanism which transfers the substrate levitated over the stage; and
- a coating mechanism which applies the coating liquid to a surface of the substrate to be transferred over the stage by the substrate transfer mechanism,
- wherein the stage includes a group of gas spray ports to spray a gas to levitate the substrate, and linear grooves to discharge gas sprayed from the gas spray ports to a side surface of the stage,
- wherein the group of gas spray ports are linearly arrayed with a predetermined interval between adjacent ports in an array direction shifted from a substrate transfer direction by a predetermined angle, such that, within the group of gas spray ports, no two adjacent ports are aligned on a straight line parallel to the substrate transfer direction in a predetermined length along the substrate transfer direction, and
- wherein the grooves extend in a first longitudinal direction that is parallel to the array direction or in a second longitudinal direction that is perpendicular to the array direction.

13. The coating system according to claim 11, wherein the predetermined angle is an angle of not less than 15° and not more than 90°.

14. The coating system according to claim 12, wherein the predetermined angle is an angle of not less than 15° and not more than 90°.

* * * * *